United States Patent
Muthuswamy

(10) Patent No.: US 11,953,532 B2
(45) Date of Patent: Apr. 9, 2024

(54) SYSTEMS AND METHODS TO DETERMINE ELECTROCHEMICAL IMPEDANCE SPECTROGRAM RAPIDLY IN REAL TIME

(71) Applicant: Jitendran Muthuswamy, Chandler, AZ (US)

(72) Inventor: Jitendran Muthuswamy, Chandler, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 40 days.

(21) Appl. No.: 17/196,324

(22) Filed: Mar. 9, 2021

(65) Prior Publication Data

US 2021/0278450 A1    Sep. 9, 2021

Related U.S. Application Data

(60) Provisional application No. 62/987,090, filed on Mar. 9, 2020.

(51) Int. Cl.
*G01R 27/08* (2006.01)
*G01R 31/389* (2019.01)

(52) U.S. Cl.
CPC .......... *G01R 27/08* (2013.01); *G01R 31/389* (2019.01)

(58) Field of Classification Search
CPC .... G01R 27/08; G01R 31/389; G01N 33/582; G01N 21/66; G01N 33/5438; G01N 27/3277; C12Q 1/00

(Continued)

(56) References Cited

U.S. PATENT DOCUMENTS 6,427,079 B1 * 7/2002 Schneider .............. A61B 5/062
                                                              600/424
8,653,642 B2    2/2014 Sutanto et al.
(Continued)

FOREIGN PATENT DOCUMENTS

| AU | 2013201221 A1 | 3/2013 |
| JP | 5978395 B2 | 8/2016 |
| WO | 2020160455 A1 | 8/2020 |

OTHER PUBLICATIONS

Christophersen et al., "Rapid Impedance Spectrum Measurements for State-of-Health Assessment of EnergyStorage Devices," SAE International Journal of Passenger Cars—Electronic and Electrical Systems, vol. 5, No. 1, Apr. 16, 2012, pp. 246-256.

(Continued)

*Primary Examiner* — Lee E Rodak
*Assistant Examiner* — Trung Q Nguyen
(74) *Attorney, Agent, or Firm* — Withrow & Terranova, P.L.L.C.; Vincent K. Gustafson

(57) ABSTRACT

An electrochemical impedance spectrogram (EIS) measurement system includes a working electrode configured to provide a triangular excitation signal to a subject, and a counter electrode configured to measure an electrical parameter in response to the triangular excitation signal. Based on the triangular excitation signal and the measured electrical parameter, an EIS of the subject is obtained. A method for measuring an EIS of a subject includes causing a triangular excitation signal to be applied to a subject and obtaining electrical parameter measurements in response to the triangular excitation signal. The EIS of the subject is obtained based on the triangular excitation signal and the electrical parameter measurements.

19 Claims, 9 Drawing Sheets

(58) Field of Classification Search
USPC .................................................. 324/425–434
See application file for complete search history.

(56) References Cited

U.S. PATENT DOCUMENTS

| | | | |
|---|---|---|---|
| 9,067,272 | B2 | 6/2015 | Sutanto et al. |
| 10,589,124 | B2 | 3/2020 | Smith et al. |
| 10,835,184 | B2 | 11/2020 | Muthuswamy et al. |
| 10,974,065 | B2 | 4/2021 | Smith et al. |
| 2005/0173267 | A1 | 8/2005 | Muthuswamy et al. |
| 2006/0025841 | A1 | 2/2006 | McIntyre |
| 2018/0348140 | A1* | 12/2018 | Quint .................... G01N 33/582 |
| 2019/0030230 | A1 | 1/2019 | Connor |
| 2019/0183392 | A1 | 6/2019 | Hsiai et al. |
| 2019/0247668 | A1 | 8/2019 | Towe et al. |
| 2020/0245910 | A1* | 8/2020 | Mallas .................... A61B 5/686 |
| 2021/0023362 | A1* | 1/2021 | Lorenzo .................... A61N 1/08 |
| 2021/0121129 | A1 | 4/2021 | Muthuswamy et al. |

OTHER PUBLICATIONS

Wardell et al., "Relationship Between Laser Doppler Signals and Anatomy During Deep Brain Stimulation Electrode Implantation Toward the Ventral Intermediate Nucleus and Subthalamic Nucleus," Operative Neurosurgery 2, vol. 72, Nov. 27, 2012, 14 pages.

Xu et al., "Measuring Electrolyte Impedance and Noise Simultaneously by TriangularWaveform Voltage and Principal Component Analysis." Sensors, MDPI, vol. 16, No. 4:576, 15 pages.

Muthuswamy, J., U.S. Appl. No. 17/196,306, filed Mar. 9, 2021.

Smith et al., U.S. Appl. No. 17/225,711, filed Apr. 8, 2021.

Sridharan et al., U.S. Appl. No. 16/322,759, filed Feb. 1, 2019.

Irakoze et al., U.S. Appl. No. 17/113,638, filed Dec. 7, 2020.

Non-Final Office Action for U.S. Appl. No. 17/196,306, dated Mar. 8, 2023, 11 pages.

Notice of Allowance for U.S. Appl. No. 17/196,306, dated Jun. 7, 2023, 11 pages.

\* cited by examiner

SYSTEMS AND METHODS TO DETERMINE ELECTROCHEMICAL IMPEDANCE SPECTROGRAM RAPIDLY IN REAL TIME

RELATED APPLICATIONS

This application claims the benefit of provisional patent application Ser. No. 62/987,090, filed Mar. 9, 2020, the disclosure of which is hereby incorporated herein by reference in its entirety.

GOVERNMENT SUPPORT

This invention was made with government support under 1650566 awarded by The National Science Foundation. The government has certain rights in the invention.

The present application is related to concurrently filed U.S. patent application Ser. No. 17/196,306 filed on Mar. 9, 2021 and subsequently issued as U.S. Pat. No. 11,771,368 on Oct. 3, 2023 entitled "Rapid Assessment of Microcirculation in Patients to Realize Closed-Loop Systems," wherein the entire contents of the foregoing application and patent are hereby incorporated reference herein.

FIELD OF THE DISCLOSURE

This disclosure relates to measuring electrochemical impedance spectra (EIS).

BACKGROUND

Electrochemical impedance spectrogram (EIS) is a very sensitive and widely used characterization method of a material and its surface properties in an electrolyte. EIS is a diagnostic that is foundational to studies involving electrochemistry and all the applications thereof. It is used in a wide range of applications encompassing biosensors, implantable devices and packages, food monitoring, fuel cells, energy storage devices, etc. Current EIS using an electrochemical workstation typically takes several seconds to multiple minutes depending on the bandwidth of frequencies over which the impedance is being measured. Reliable electrochemical impedance measurements at low frequencies are particularly time-consuming. For instance, obtaining a reliable electrochemical impedance at 1 hertz (Hz) or <1 Hz frequency requires a wait of several seconds to obtain multiple repeats of sinusoidal waves at that frequency.

There are many applications where a rapid EIS would allow tracking impedance changes in real time. EIS changes reflect underlying physiological processes, or material surface changes, or more generally changes in the electrolyte that can often be rapid (e.g., less than one second to a few seconds). However, some of the current advanced electrochemical workstations (such as the one from ZAHNER-elektrik GmbH & Co. KG) use a sum-of-sine wave approach to determine the electrochemical impedance simultaneously at multiple frequencies, which can take several seconds or longer to obtain results.

SUMMARY

Systems and methods to determine an electrochemical impedance spectrogram (EIS) rapidly in real time are provided. Embodiments described herein provide an approach to determine an EIS rapidly (e.g., much less than one second) over a wide band of frequencies. Since the EIS is a foundational diagnostic that is used in a wide variety of applications involving electrochemical events, the proposed approach will significantly impact a wide range of applications. Novel waveforms and systems analysis techniques are used to determine the electrochemical impedance over a wide range of frequencies simultaneously.

Current techniques to determine an EIS typically (depending on the start frequency and number of samples along the frequency axis) take several seconds to minutes to measure the EIS over a similar range of frequencies. Some more advanced existing techniques use a sum-of-sines approach to determine the EIS over a wide range of frequencies simultaneously, but still take at least several seconds to achieve a result. The approach described herein is distinct from the sum-of-sines approach in that embodiments use a novel signals and systems approach to sample the frequency axis at multiple points and determine the impedance spectra simultaneously.

Embodiments can be readily integrated into conventional electrochemical workstations and embedded devices. Other embodiments can be instantiated into custom-made hardware depending on the needs of a given application. The speed and resolution of the EIS obtained using this approach can be tailored to a wide variety of applications. This approach provides an EIS having a time-frequency distribution of electrochemical impedance at unprecedented resolution in the time and frequency axis that are determined at unprecedented speeds.

An exemplary embodiment provides a method for measuring an EIS in real time. The method includes applying a triangular excitation signal to a subject; obtaining electrical parameter measurements in response to the triangular excitation signal; and measuring an EIS of the subject based on the electrical parameter measurements.

Another exemplary embodiment provides an EIS measurement system. The EIS system includes a working electrode configured to provide a triangular excitation signal to a subject; a counter electrode configured to measure an electrical parameter in response to the excitation signal; and a processing device configured to obtain an EIS of the subject based on the triangular excitation signal and the measured electrical parameter.

Another exemplary embodiment provides a non-transitory computer-readable medium which, when executed by a processing device, causes the processing device to: cause a triangular excitation signal to be applied to a subject; obtain electrical parameter measurements in response to the triangular excitation signal; and measure an EIS of the subject based on the electrical parameter measurements.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
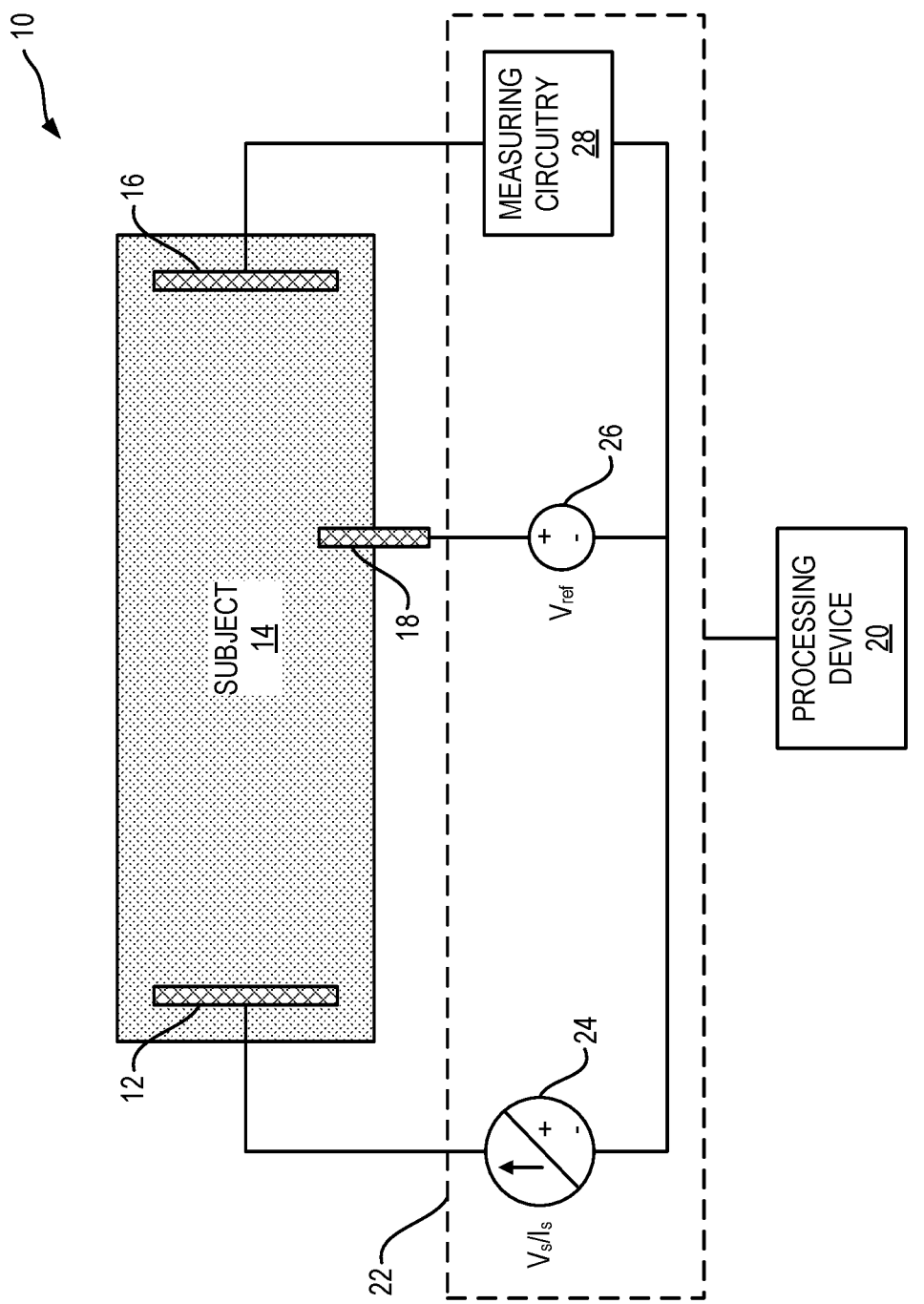
FIG. 1 is a block schematic diagram of an electrochemical impedance spectrogram (EIS) measurement system according to embodiments described herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Systems and methods to determine an electrochemical impedance spectrogram (EIS) rapidly in real time are provided. Embodiments described herein provide an approach to determine an EIS rapidly (e.g., much less than one second) over a wide band of frequencies. Since the EIS is a foundational diagnostic that is used in a wide variety of applications involving electrochemical events, the proposed approach will significantly impact a wide range of applications. Novel waveforms and systems analysis techniques are used to determine the electrochemical impedance over a wide range of frequencies simultaneously.

Current techniques to determine an EIS typically (depending on the start frequency and number of samples along the frequency axis) take several seconds to minutes to measure the EIS over a similar range of frequencies. Some more advanced existing techniques use a sum-of-sines approach to determine the EIS over a wide range of frequencies simultaneously, but still take at least several seconds to achieve a result. The approach described herein is distinct from the sum-of-sines approach in that embodiments use a novel signals and systems approach to sample the frequency axis at multiple points and determine the impedance spectra simultaneously.

Embodiments can be readily integrated into conventional electrochemical workstations and embedded devices. Other embodiments can be instantiated into custom-made hardware depending on the needs of a given application. The speed and resolution of the EIS obtained using this approach can be tailored to a wide variety of applications. This approach provides an EIS having a time-frequency distribution of electrochemical impedance at unprecedented resolution in the time and frequency axis that are determined at unprecedented speeds.

I. Introduction

Electrochemical systems are inherently non-linear and therefore linear systems analysis techniques are not directly applicable. However, under small signal (<50 millivolts (mV)) voltage excitation, electrochemical systems are typically assumed to be linear. Embodiments described herein provide a small amplitude triangular excitation signal and make measurements in response to the excitation signal. For example, a triangular excitation voltage signal can be provided, with an amplitude between −50 mV and 50 mV, can be applied to a subject, and a current response can be measured. In another example, a triangular excitation current signal can be provided, with an amplitude of less than 5 milliamps (mA), can be applied to a subject, and a voltage response can be measured.

The triangular signal waveform (e.g., v(t) or i(t), depending on application) samples the frequency spectra at harmonics of the fundamental frequency (where fundamental frequency=1/a time-period of the triangular waveform) over a wide range of frequencies starting from the fundamental. A Fourier transform of the voltage waveform (v(t), which can be the excitation voltage or the response voltage) is performed to obtain a voltage spectrogram V(w). Similarly, a Fourier transform of the current waveform (i(t), which can be the response current or the excitation current) is performed to obtain a current spectrogram I(w).

A ratio of V(w) to I(w) is determined over the entire range of frequencies (fundamental and the harmonics thereafter) to obtain an impedance spectrogram, Z(w). Thus, an EIS sampled (e.g., sampled at harmonics of the fundamental excitation frequency) over a wide range of frequencies is obtained in 3 rapid steps (that can take a fraction of one second)—(1) generation of a small-amplitude, triangular excitation waveform (voltage/current), (2) measurement of electrical parameter (current/voltage) in response to the excitation waveform, and lastly (3) determining the ratio of the Fourier transforms of the voltages and currents to obtain Z(w).

Some electrochemical systems can take several cycles of the triangular waveforms initially to achieve steady state. But once the system reaches steady state, the time taken to determine EIS over a band of frequencies using this approach depends on the lowest frequency at which the impedance has to be determined (which determines the period of the triangular waveform). For instance, to determine the EIS starting at a fundamental frequency of 1 hertz (Hz) (and at every harmonic thereafter), one would need a triangular waveform with a period of 1 second (s). However, to determine the EIS starting at a fundamental frequency of 10 Hz (and at every harmonic thereafter), one would only need a triangular wave of duration 100 milliseconds (ms). Similarly, to determine the EIS starting at a fundamental frequency of 100 Hz (and at every harmonic thereafter), one would need a triangular waveform of 10 ms and so on.

Since the triangular excitation waveform is pre-determined, the Fourier transform of these waveforms can be generated a priori, further reducing the time to determine the wideband EIS. Numerous techniques (e.g., using software and/or hardware involving the use of specialized conventional digital signal processing microchips) can be used to instantiate embodiments in different configurations suitable to the needs of a given application.

Thus, embodiments result in an EIS that can provide a time-frequency distribution of electrochemical impedance values at unprecedented resolutions in both time and frequency axis at unprecedented speeds (e.g., fractions of one second). Such measurements facilitate fundamental discoveries of electrochemical events at the interface of materials and electrolytes. In particular, embodiments provide rapid EIS measurement in biosensors and implantable devices, laboratory systems studying cells of different types and pathogens, fuel cells and energy storage devices, etc.

II. EIS Measurement System

FIG. 1 is a block schematic diagram of an EIS measurement system 10 according to embodiments described herein. The EIS measurement system 10 can include a 2-electrode or 3-electrode sensor design. In this regard, the EIS measurement system 10 includes a working electrode 12 which provides a triangular excitation signal to a subject 14. The EIS measurement system 10 further includes a counter electrode 16 which is used to measure an electrical parameter in response to the triangular excitation signal.

In a first example, the triangular excitation signal provided by the working electrode 12 is a voltage signal (v(t)), and the electrical parameter measured at the counter electrode 16 is a current response (i(t)). In a second example, the triangular excitation signal provided by the working electrode 12 is a current signal (i(t)), and the electrical parameter measured at the counter electrode 16 is a voltage response (v(t)). In a 3-electrode sensor design, the EIS measurement system 10 further includes a reference electrode 18 which provides a reference voltage (e.g., a ground or other reference level, $V_{ref}$) for the working electrode 12 and/or the counter electrode 16. In a 2-electrode sensor design, the counter electrode 16 is instead configured to provide a reference voltage.

The subject 14 can be a liquid, solid, gas, gel, or other material of interest. For example, the subject 14 can be an electrolyte solution. The working electrode 12 can be in contact with the subject 14 at an appropriate position (e.g., within the electrolyte solution or on a first surface of the subject 14). The counter electrode 16 can be in contact with the subject 14 at another position (e.g., away from the working electrode 12 and within the electrolyte solution or on a second surface of the subject 14). In some embodiments, the reference electrode 18 is positioned between the working electrode 12 and the counter electrode 16, and in other embodiments the reference electrode 18 is positioned adjacent to or away from the working electrode 12 or the counter electrode 16.

The EIS measurement system 10 further includes a processing device 20 which obtains the EIS of the subject 14. As described above, the EIS produced by the processing device 20 can be a sampled spectrogram based on the triangular excitation signal and the measured electrical parameter. The processing device 20 can include or be coupled to additional circuitry 22, such as an excitation source 24, a reference source 26, and measuring circuitry 28. For example, where the triangular excitation signal is a voltage signal, the measuring circuitry 28 can measure the response current (e.g., using a voltage divider or other circuitry) through the counter electrode 16 and provide an indication (e.g., a voltage signal representative of the response current) to the processing device 20. In other examples, measurements may be performed directly by the processing device 20.

The processing device 20 represents one or more commercially available or proprietary general-purpose processing devices, such as a microprocessor, central processing unit (CPU), or the like. The processing device 20 may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 20 may be a microprocessor, or may be any conventional processor, controller, microcontroller, or state machine. The processing device 20 may also be implemented as a combination of computing devices (e.g., a combination of a DSP and a microprocessor, a plurality of microprocessors, one or more microprocessors in conjunction with a DSP core, or any other such configuration).

The processing device 20 can cause the triangular excitation signal to be generated in an appropriate manner. For example, the triangular excitation signal is readily generated in current conventional electrochemical workstations using a cyclic-voltammogram feature. In embedded systems, the processing device 20 includes or is connected to the excitation source 24, which can provide a triangular excitation signal having a desired shape, period (e.g., resolution) and amplitude (e.g., according to material properties of the subject 14). In further examples, the excitation source 24 may be programmable to provide triangular excitation signals with different shapes (e.g., a ramp signal, a sawtooth signal, a combination signal), different periods (e.g., a constant or varying period), and different amplitudes (e.g., an amplitude which is constant over periods or varying across periods).

In an exemplary aspect, the processing device 20 causes the working electrode 12 to generate the triangular excitation signal (v(t) or i(t)) and obtains an electrical parameter measurement (i(t) or v(t)) at the counter electrode 16 in response to the triangular excitation signal. The processing device 20 further obtains a Fourier transform of the triangular excitation signal (e.g., by performing a fast Fourier transform (FFT) or retrieving a stored Fourier transform from memory) and a Fourier transform (e.g., FFT) of the measured electrical parameter. In this manner, the processing device 20 obtains a voltage spectrogram V(w) and a current spectrogram I(w), and uses a ratio of V(w) to I(w) to obtain a corresponding impedance spectrogram Z(w). From the impedance spectrogram Z(w), the processing device 20 determines the EIS, as described further below.

In some embodiments, the processing device 20 includes or is coupled to a memory storing one or more measurement profiles. The measurement profile(s) may include excitation signal parameters (e.g., whether a voltage or current waveform is to be generated, a shape, an amplitude, a period), a Fourier transform of the excitation signal, an expected range of response signal, and so on. The measurement profile(s) may improve performance of the EIS measurement system 10 and/or provide flexibility to measure multiple types of subjects 14.

A. Example Triangular Excitation Signals

Figure 2A:
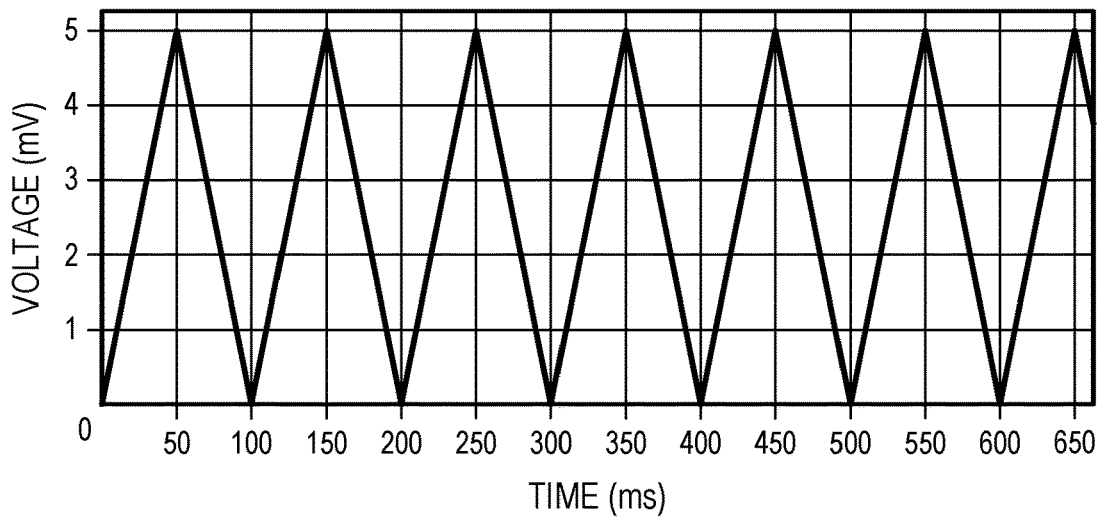
FIG. 2A is a graphical representation of a ramp excitation voltage signal with an amplitude of 5 millivolts (mV) at 100 mV per second (mV/s).
Figure 2B:
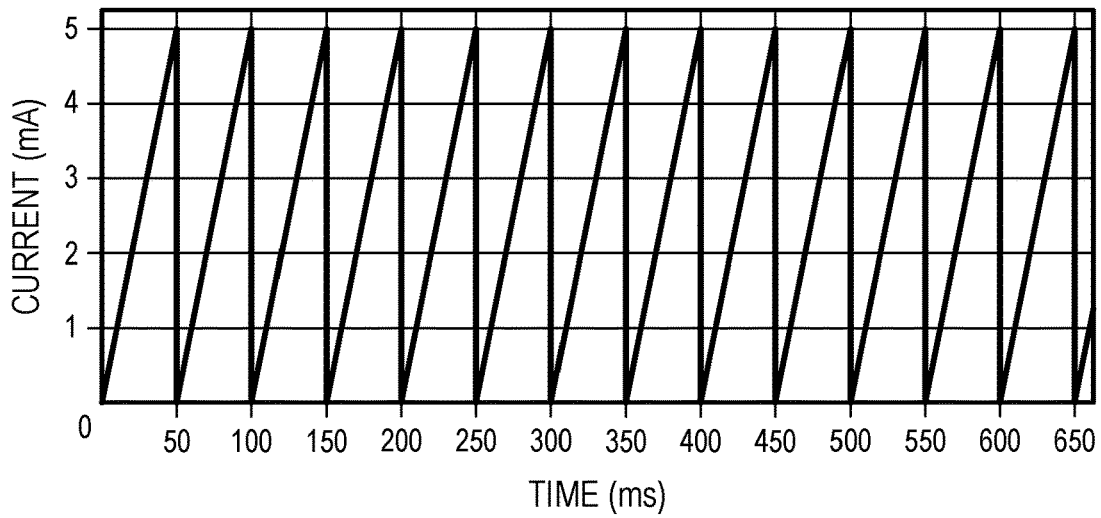
FIG. 2B is a graphical representation of a sawtooth excitation current signal with an amplitude of 5 milliamps (mA) at 100 mV/s.
Figure 2C:
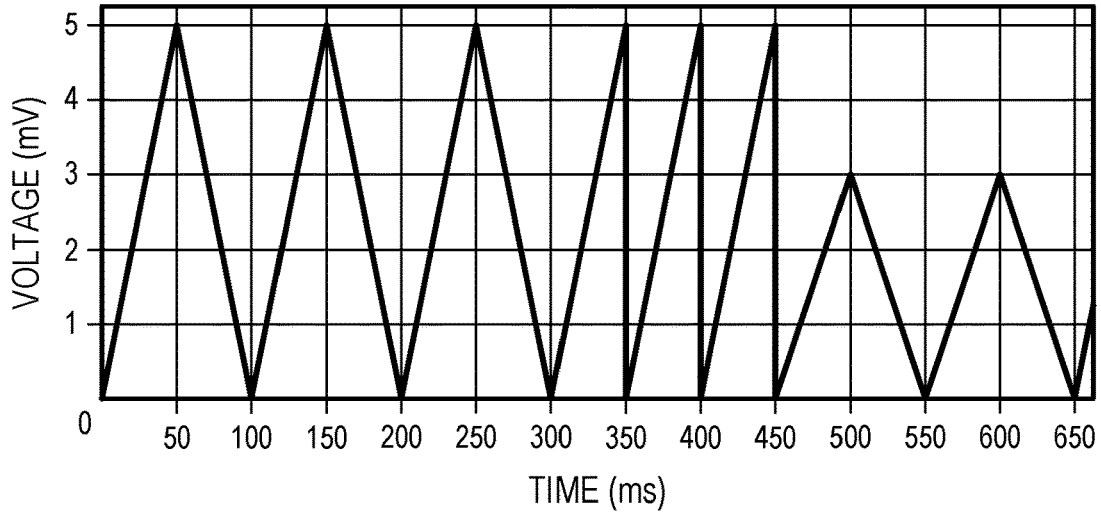
FIG. 2C is a graphical representation of a mixed ramp and sawtooth excitation voltage signal with a varying amplitude.

FIGS. 2A-2C illustrate various examples of excitation signals which may be generated by the EIS measurement system 10 of FIG. 1. For example, FIG. 2A is a graphical representation of a ramp excitation voltage signal with an amplitude of 5 mV at 100 mV per second (mV/s). As demonstrated further below, this excitation voltage signal results in a current response. Because the ramp excitation voltage signal has a period of 100 ms, it results in an EIS resolution of 10 Hz.

FIG. 2B is a graphical representation of a sawtooth excitation current signal with an amplitude of 5 mA at 100 mV/s. This excitation current signal results in a voltage response. Because the sawtooth excitation current signal has a period of 50 ms, it results in an EIS resolution of 20 Hz.

FIG. 2C is a graphical representation of a mixed ramp and sawtooth excitation voltage signal with a varying amplitude. In addition to uniform signals (e.g., as in FIGS. 2A and 2B), some embodiments may use mixed signals having multiple waveform shapes, amplitudes, and/or periods (e.g., for different applications, such as a different material or to measure particular types of responses).

B. Example Measurements

Figure 3A:
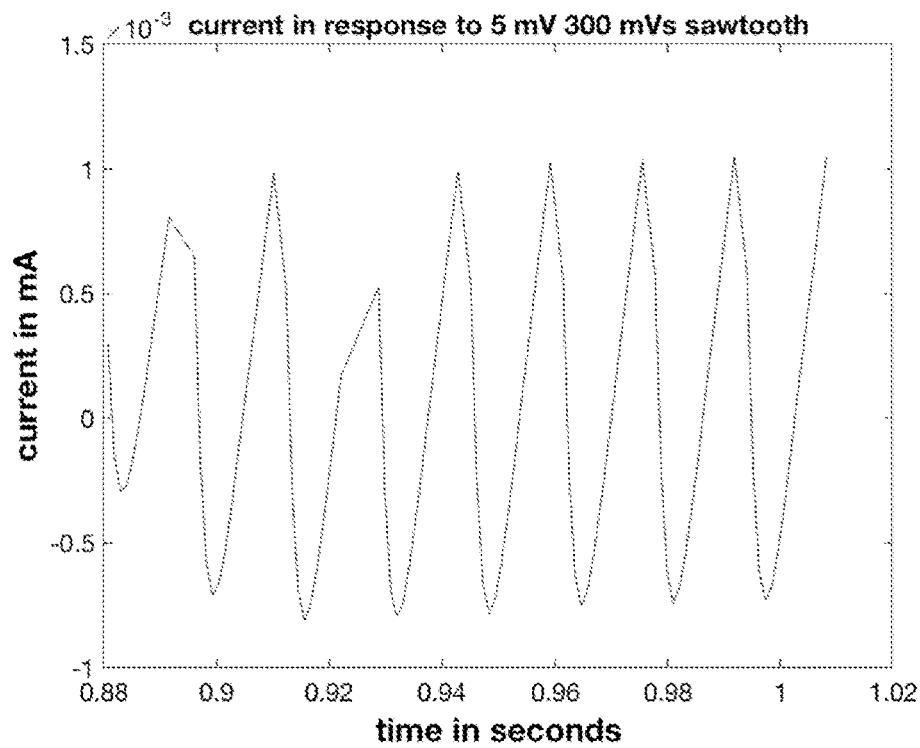
FIG. 3A is a graphical representation of current measurements in response to a 5 mV, 300 mV/s sawtooth excitation voltage signal.
Figure 3B:
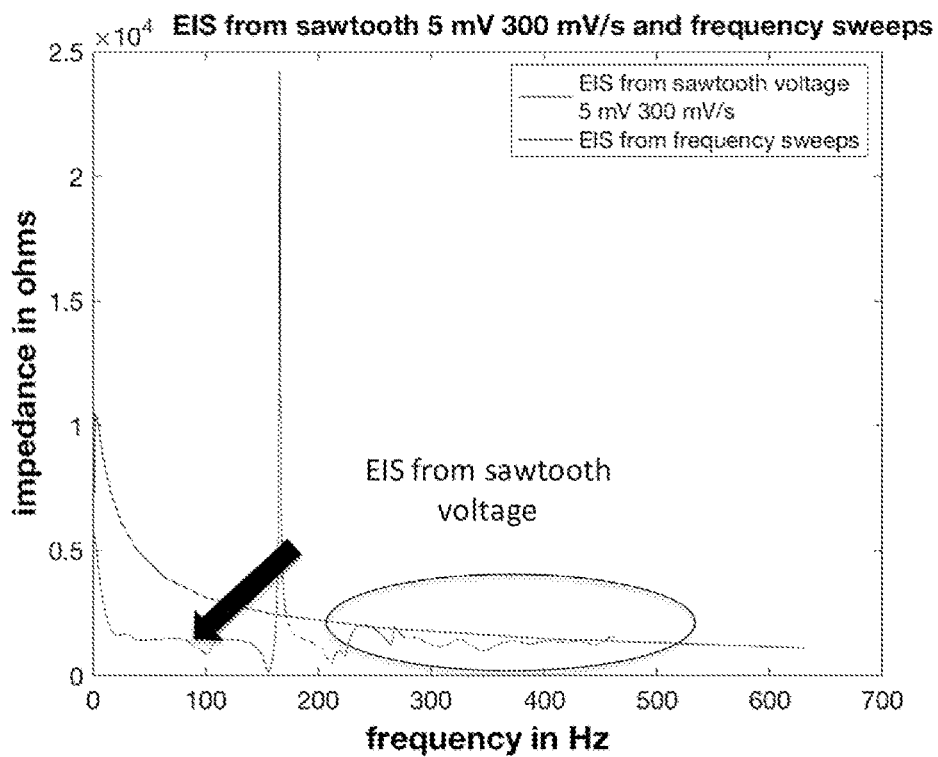
FIG. 3B is a graphical representation of a measured EIS in response to the sawtooth excitation voltage signal and current measurements of FIG. 3A.

FIG. 3A is a graphical representation of current measurements in response to a 5 mV, 300 mV/s sawtooth excitation voltage signal. FIG. 3B is a graphical representation of a measured EIS in response to the sawtooth excitation voltage signal and current measurements of FIG. 3A. The smooth curve represents the EIS from a traditional frequency sweep. The encircled region shows good agreement between the EIS obtained from the traditional frequency sweep (over several minutes) and the EIS obtained from sawtooth voltages (over a minimum of 0.02 seconds to 1 second).

In the example of FIGS. 3A and 3B, a major discrepancy is seen in the EIS at low frequencies. Any spikes are due to noise from resolution issues in the FFT. The EIS from sawtooth is also wavy with values at the crests being more reliable due to high signal-to-noise ratio (SNR). In an exemplary aspect, the processing device 20 of FIG. 1 is configured to produce a sampled EIS using the peak values (e.g., values at harmonics of the fundamental frequency of the excitation signal) within a range that is considered reliable for the given material and excitation signal. For example, a measurement profile may be associated with the material of the subject being measured, and the measurement profile may include a frequency range where the EIS is considered accurate (e.g., in addition to excitation signal parameters, a Fourier transform of the excitation signal, an expected range of response signal, etc.).

Figure 4:
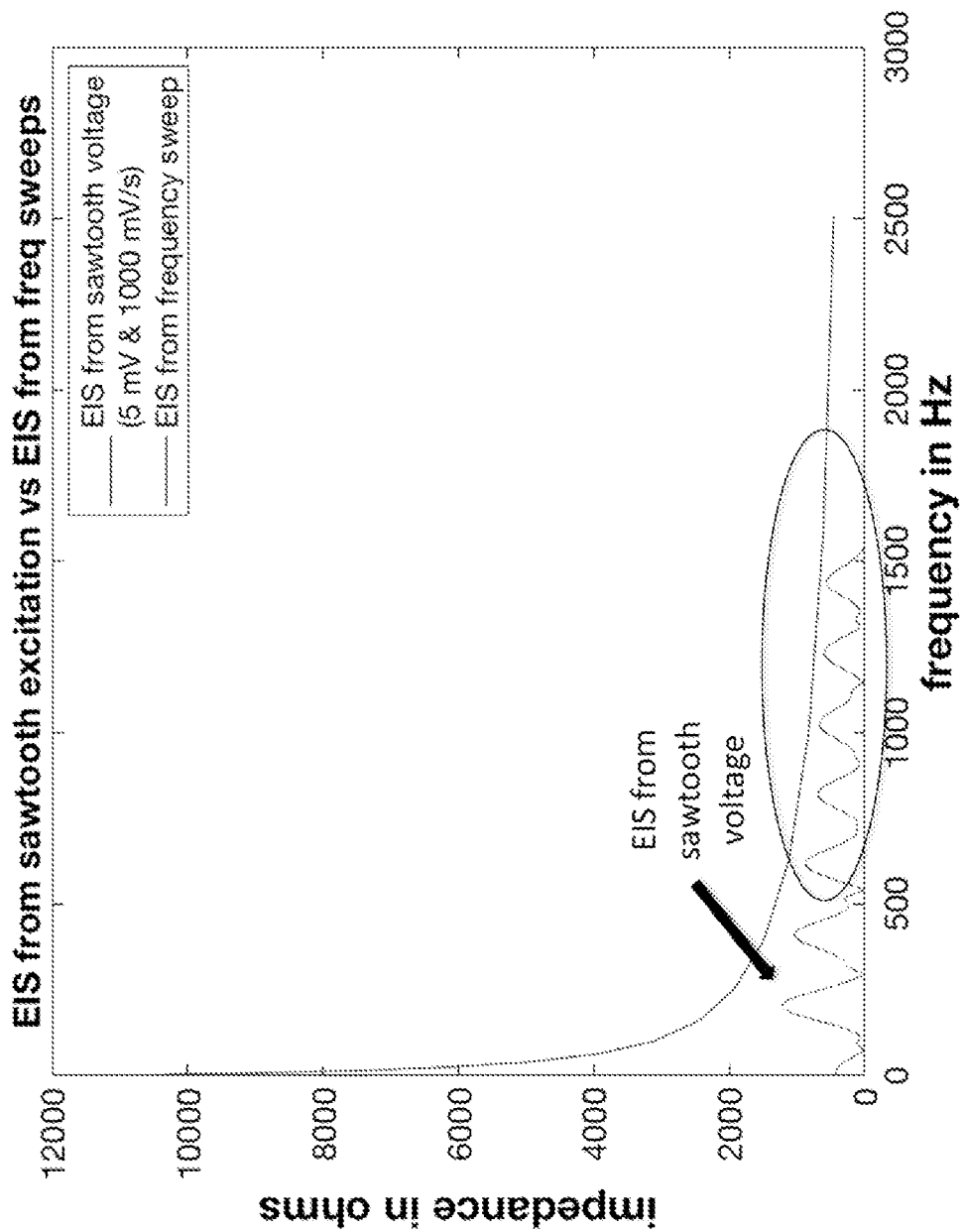
FIG. 4 is a graphical representation of a measured EIS in response to a 5 mV, 1000 mV/s sawtooth excitation voltage signal.

FIG. 4 is a graphical representation of a measured EIS in response to a 5 mV, 1000 mV/s sawtooth excitation voltage signal. The smooth curve represents the EIS from a traditional frequency sweep. The encircled region shows good agreement between the EIS obtained from the traditional frequency sweep (over several minutes) and the EIS obtained from the sawtooth excitation voltage signal (over a minimum of 0.005 seconds to 1 second). Major discrepancy is seen at low frequencies. Any spikes are due to noise from resolution issues in the FFT. The EIS from sawtooth is also wavy with values at the crests being more reliable due to high SNR.

Figure 5A:
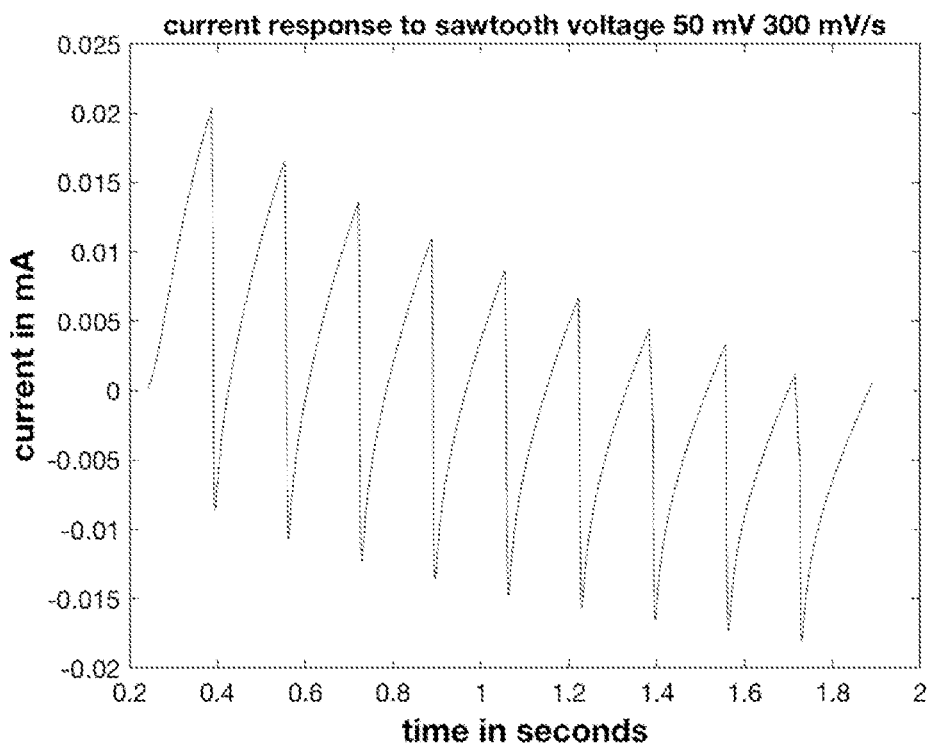
FIG. 5A is a graphical representation of current measurements in response to a 50 mV, 300 mV/s sawtooth excitation voltage signal.
Figure 5B:
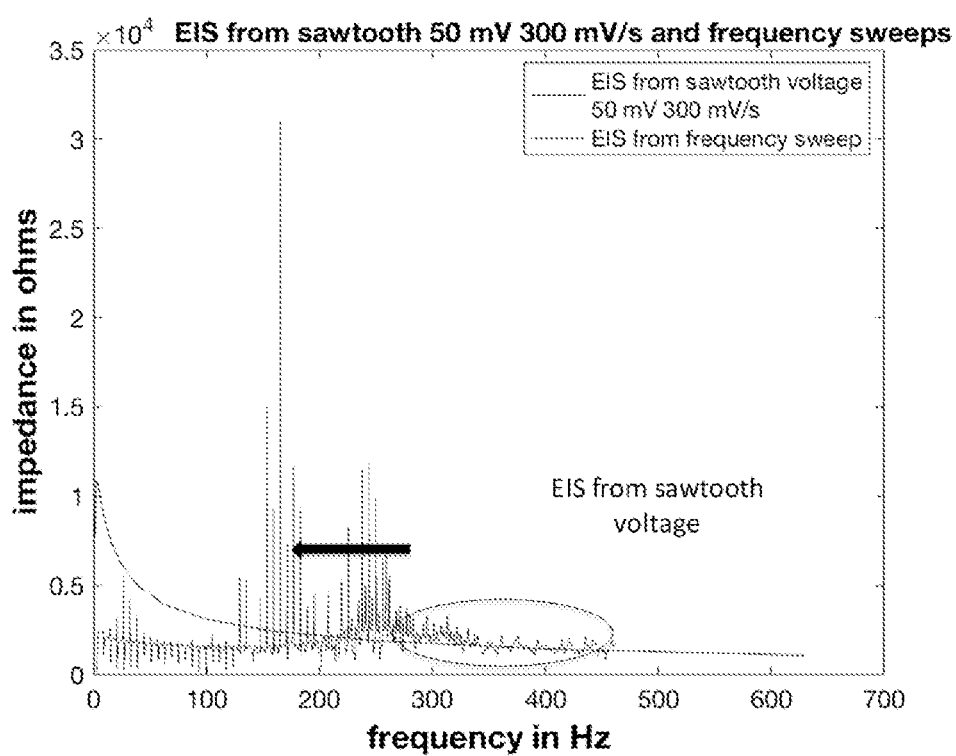
FIG. 5B is a graphical representation of a measured EIS in response to the sawtooth excitation voltage signal and current measurements of FIG. 5A.

FIG. 5A is a graphical representation of current measurements in response to a 50 mV, 300 mV/s sawtooth excitation voltage signal. FIG. 5B is a graphical representation of a measured EIS in response to the sawtooth excitation voltage signal and current measurements of FIG. 5A. The smooth curve represents the EIS from a traditional frequency sweep. The encircled region shows good agreement between the EIS obtained from the traditional frequency sweep (over several minutes) and the EIS obtained from the sawtooth excitation voltage signal (over a minimum of 0.2 seconds to 1 second). Major discrepancy is seen at low frequencies. Any spikes are due to noise from resolution issues in the FFT. The EIS from sawtooth is also wavy with values at the crests being more reliable due to high SNR.

Figure 6A:
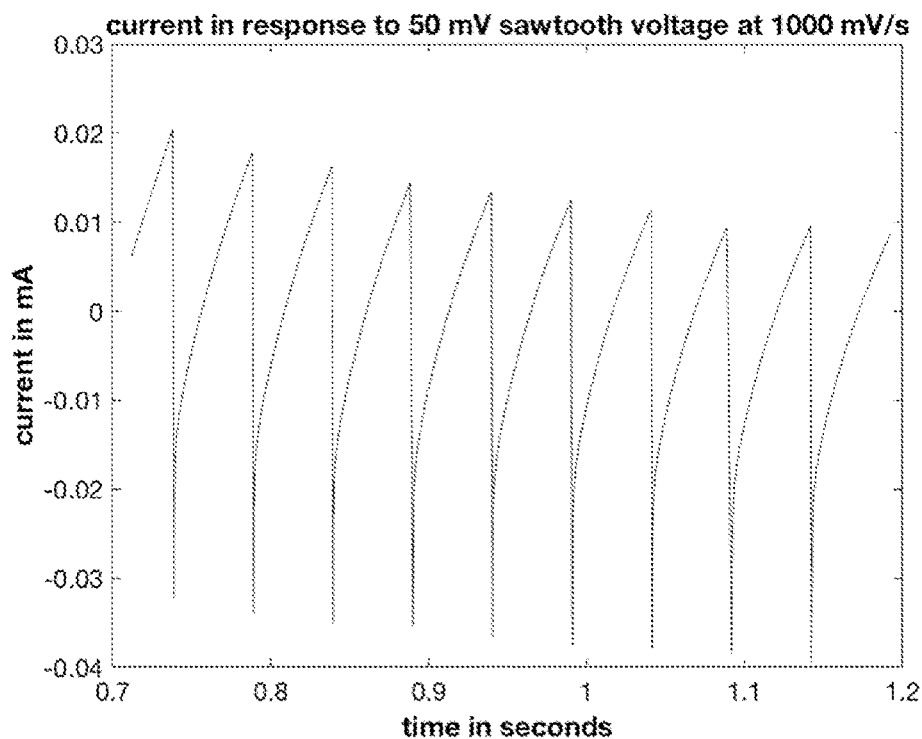
FIG. 6A is a graphical representation of current measurements in response to a 50 mV, 1000 mV/s sawtooth excitation voltage signal.
Figure 6B:
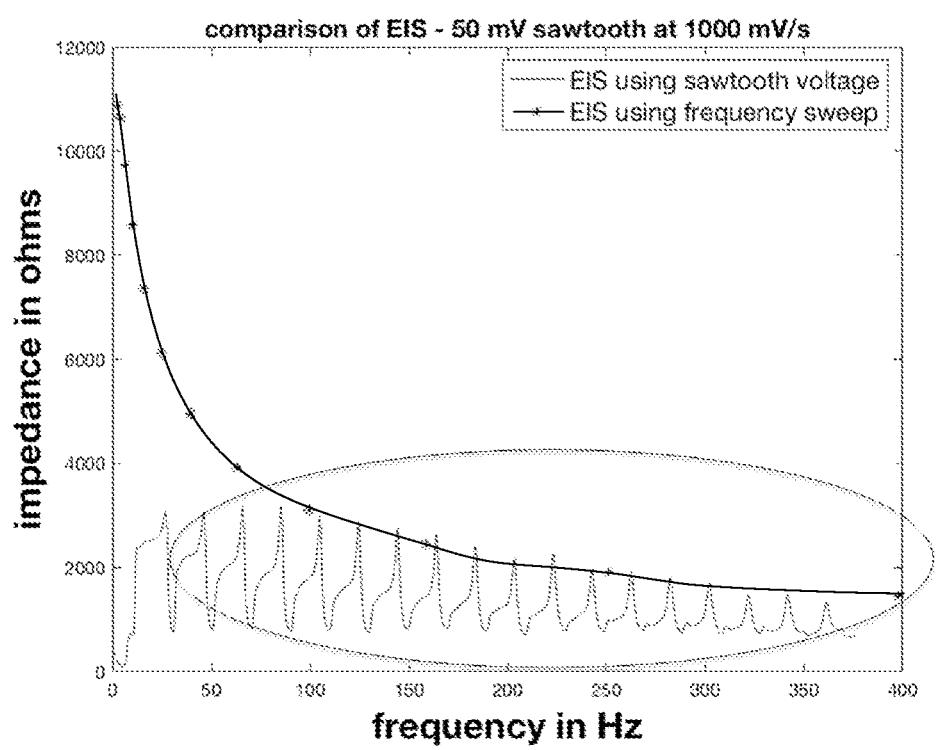
FIG. 6B is a graphical representation of a measured EIS in response to the sawtooth excitation voltage signal and current measurements of FIG. 6A.

FIG. 6A is a graphical representation of current measurements in response to a 50 mV, 1000 mV/s sawtooth excitation voltage signal. FIG. 6B is a graphical representation of a measured EIS in response to the sawtooth excitation voltage signal and current measurements of FIG. 6A. The smooth curve represents the EIS from a traditional frequency sweep. The encircled region shows good agreement between the EIS obtained from the traditional frequency sweep (over several minutes) and the EIS obtained from the sawtooth excitation voltage signal (over a minimum of 0.05 seconds to 1 second). Major discrepancy is seen at low frequencies. Any spikes are due to noise from resolution issues in the FFT. The EIS from sawtooth is also wavy with values at the crests being more reliable due to high SNR.

Figure 7:
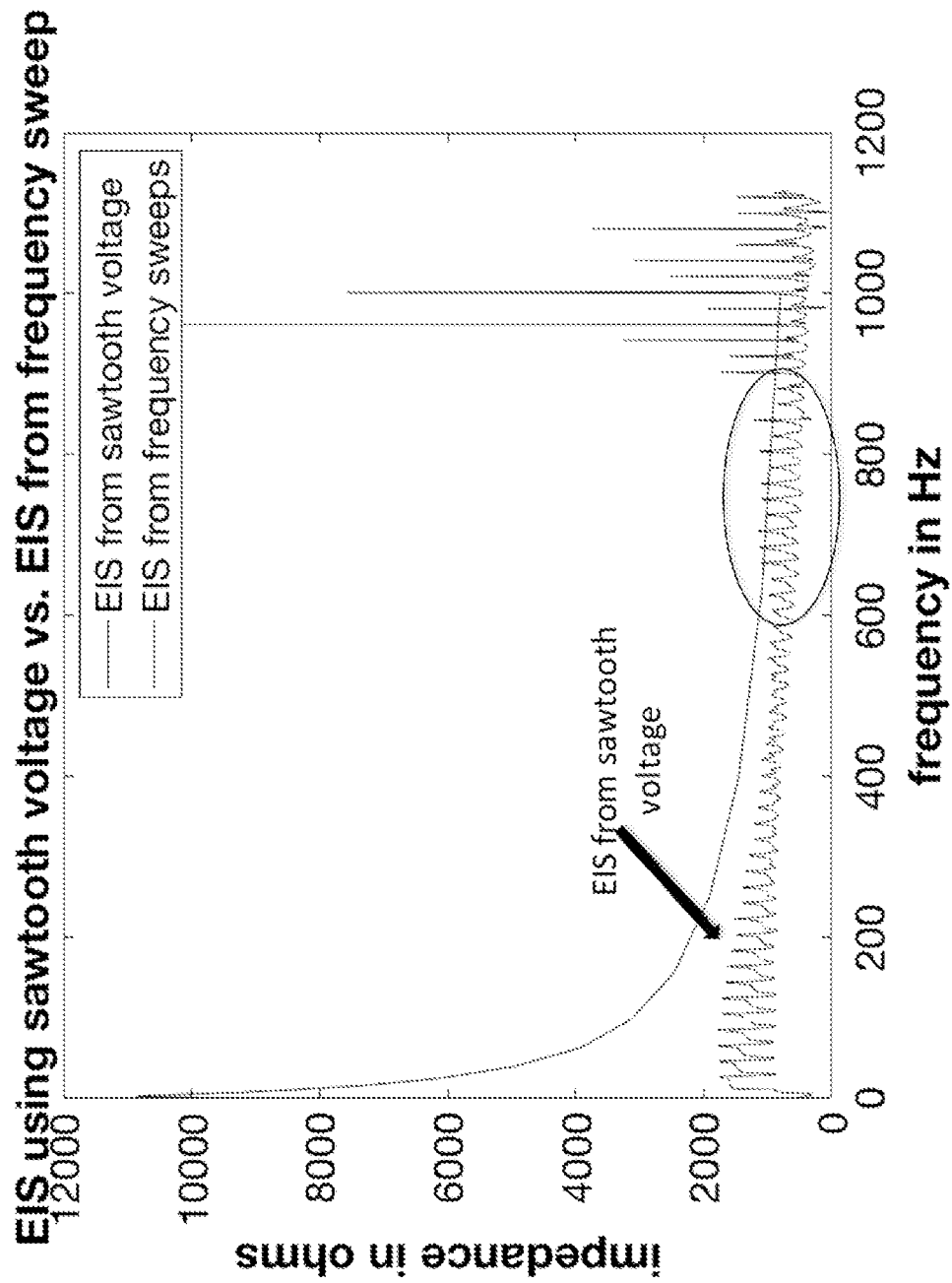
FIG. 7 is a graphical representation comparing an EIS obtained using sawtooth voltages with an EIS obtained using frequency sweeps.

FIG. 7 is a graphical representation comparing an EIS obtained using sawtooth voltages with an EIS obtained using frequency sweeps. The smooth curve represents the EIS from frequency sweeps. The encircled region shows good agreement between the EIS obtained from traditional frequency sweeps (over several minutes) and the EIS obtained from sawtooth voltages (over a minimum of 0.05 seconds to 1 second). Major discrepancy is seen at low frequencies. Any spikes are due to noise from resolution issues in the FFT. The EIS from sawtooth is also wavy with values at the crests being more reliable due to high SNR.

III. Flow Diagram

Figure 8:
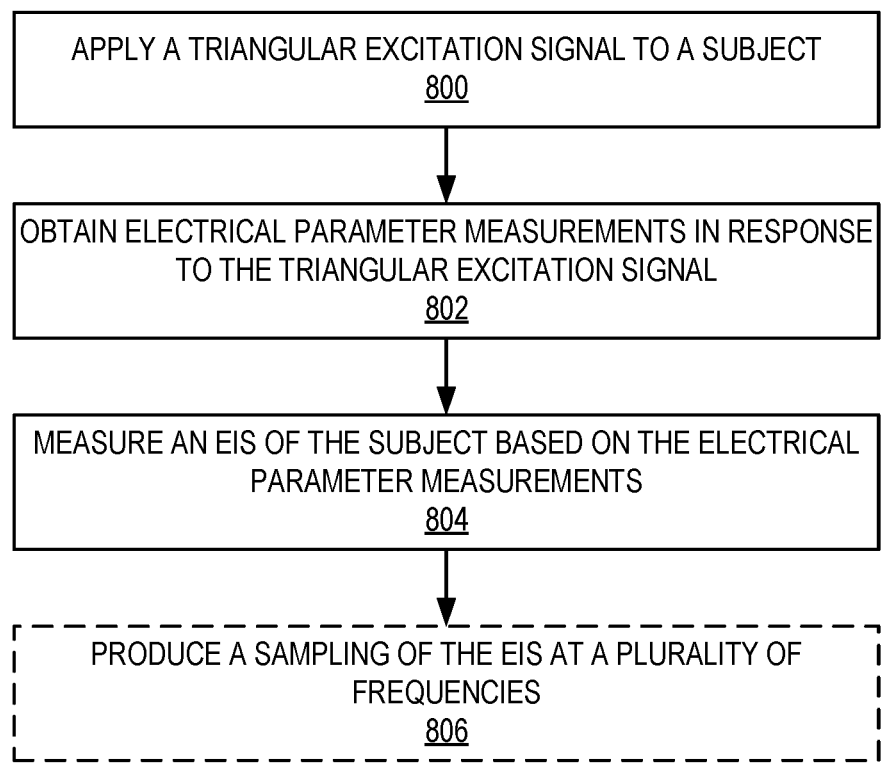
FIG. 8 is a flow diagram illustrating a process for measuring an EIS in real time.

FIG. 8 is a flow diagram illustrating a process for measuring an EIS in real time. Dashed boxes represent optional steps. The process begins at operation 800, with applying a triangular excitation signal to a subject (e.g., the subject 14 of FIG. 1). In an exemplary aspect, the excitation signal is a voltage signal (or a current signal) with a sawtooth or ramp waveform. The process continues at operation 802, with obtaining electrical parameter measurements in response to the triangular excitation signal. In an exemplary aspect, the electrical parameter measurements are current measurements (or voltage measurements).

The process continues at operation 804, with measuring an EIS of the subject based on the electrical parameter measurements. Measuring the EIS of the subject can include determining a ratio of Fourier transforms (e.g., FFTs) of voltages of the triangular excitation signal and corresponding current measurements. The process optionally continues at operation 806, with producing a sampling of the EIS at a plurality of frequencies.

Although the operations of FIG. 8 are illustrated in a series, this is for illustrative purposes and the operations are not necessarily order dependent. Some operations may be performed in a different order than that presented. Further, processes within the scope of this disclosure may include fewer or more steps than those illustrated in FIG. 8.

IV. Computer System

Figure 9:
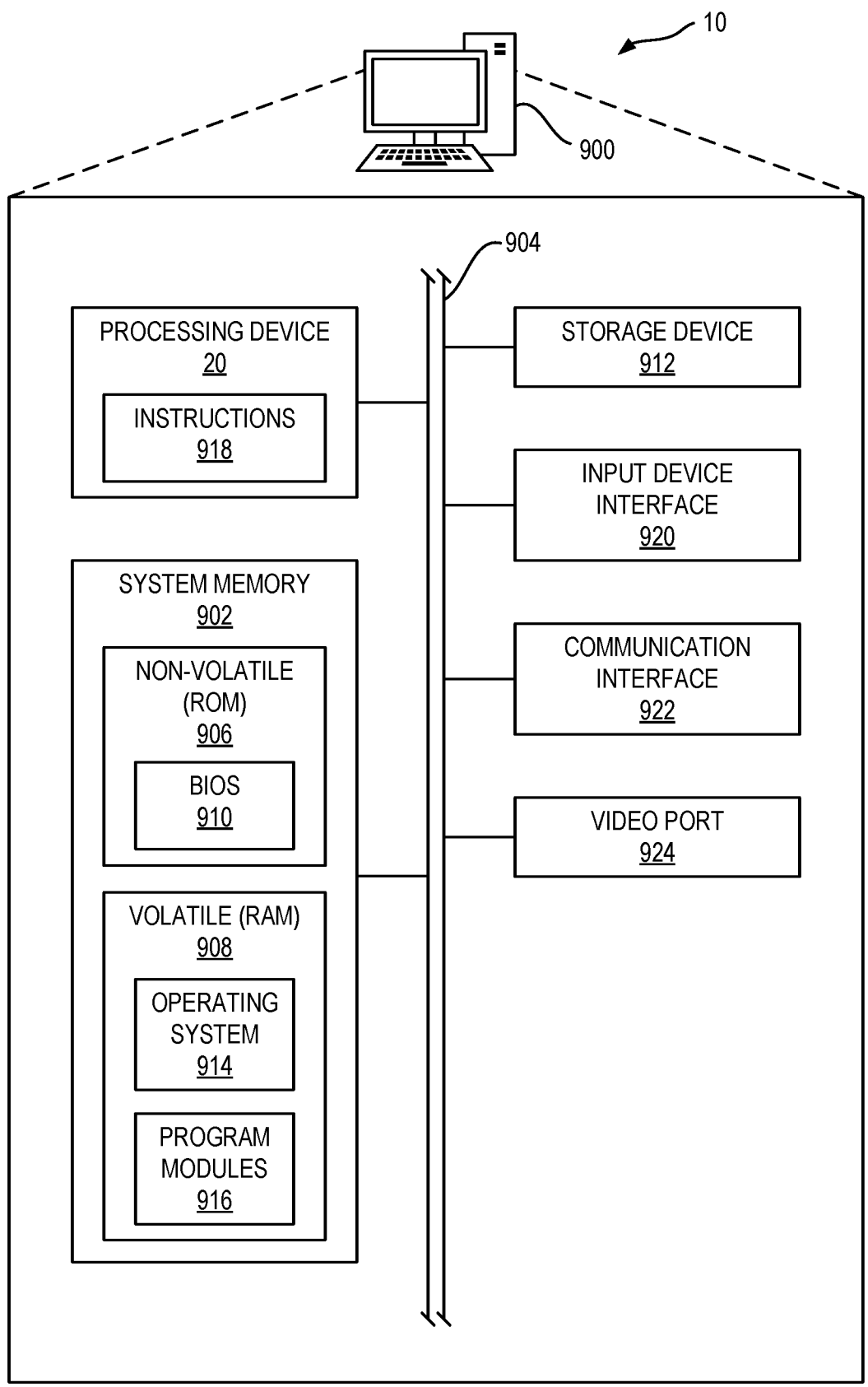
FIG. 9 is a block diagram of an EIS measurement system suitable for implementing the method for measuring an EIS in real time according to embodiments disclosed herein.

FIG. 9 is a block diagram of an EIS measurement system 10 suitable for implementing the method for measuring an EIS in real time according to embodiments disclosed herein. The EIS measurement system 10 includes or is implemented as a computer system 900, which comprises any computing or electronic device capable of including firmware, hardware, and/or executing software instructions that could be used to perform any of the methods or functions described above, such as measuring the EIS in real time as a function of measured responses to a triangular excitation signal. In this regard, the computer system 900 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 900 in this embodiment includes a processing device 20 or processor, a system memory 902, and a system bus 904. The system memory 902 may include non-volatile memory 906 and volatile memory 908. The non-volatile memory 906 may include read-only memory (ROM), erasable programmable read-only memory (EPROM), electrically erasable programmable read-only memory (EEPROM), and the like. The volatile memory 908 generally includes random-access memory (RAM) (e.g., dynamic random access memory (DRAM), such as synchronous DRAM (SDRAM)). A basic input/output system (BIOS) 910 may be stored in the non-volatile memory 906 and can include the basic routines that help to transfer information between elements within the computer system 900.

The system bus 904 provides an interface for system components including, but not limited to, the system memory 902 and the processing device 20. The system bus 904 may be any of several types of bus structures that may further interconnect to a memory bus (with or without a memory controller), a peripheral bus, and/or a local bus using any of a variety of commercially available bus architectures.

As described above, the processing device 20 represents one or more commercially available or proprietary general-purpose processing devices, such as a microprocessor, CPU, or the like. More particularly, the processing device 20 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 20 is configured to execute processing logic instructions for performing the operations and steps discussed herein. In this regard, the various illustrative logical blocks, modules, and circuits described in connection with the embodiments disclosed herein may be implemented or performed with the processing device 20.

The computer system 900 may further include or be coupled to a non-transitory computer-readable storage medium, such as a storage device 912, which may represent an internal or external hard disk drive (HDD), flash memory, or the like. The storage device 912 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 914 and any number of program modules 916 or other applications can be stored in the volatile memory 908, wherein the program modules 916 represent a wide array of computer-executable instructions corresponding to programs, applications, functions, and the like that may implement the functionality described herein in whole or in part, such as through instructions 918 on the processing device 20. The program modules 916 may also reside on the storage mechanism provided by the storage device 912. As such, all or a portion of the functionality described herein may be implemented as a computer program product stored on a transitory or non-transitory computer-usable or computer-readable storage medium, such as the storage device 912, non-volatile memory 906, volatile memory 908, instructions 918, and the like. The computer program product includes complex programming instructions, such as complex computer-readable program code, to cause the processing device 20 to carry out the steps necessary to implement the functions described herein.

An operator, such as the user, may also be able to enter one or more configuration commands to the computer system 900 through a keyboard, a pointing device such as a mouse, or a touch-sensitive surface, such as the display device, via an input device interface 920 or remotely through a web interface, terminal program, or the like via a communication interface 922. The communication interface 922 may be wired or wireless and facilitate communications with any number of devices via a communications network in a direct or indirect fashion. An output device, such as a display device, can be coupled to the system bus 904 and driven by a video port 924. Additional inputs and outputs to the computer system 900 may be provided through the system bus 904 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A method for measuring an electrochemical impedance spectrogram (EIS) in real time, the method comprising:
    causing, by a processing device, a triangular excitation signal to be applied to a subject;
    obtaining electrical parameter measurements in response to the triangular excitation signal;
    measuring, by the processing device, an EIS of the subject based on the electrical parameter measurements, wherein the EIS of the subject is based on a ratio of a voltage spectrogram and a current spectrogram;
    sampling the EIS of the subject at a plurality of frequencies that comprises multiple harmonics of a fundamental frequency of the triangular excitation signal; and
    causing, by the processing device, the EIS to be provided to a workstation.

2. The method of claim 1, wherein:
    the triangular excitation signal comprises a voltage signal; and
    the electrical parameter measurements comprise current measurements.

3. The method of claim 1, wherein:
    the triangular excitation signal comprises a current signal; and
    the electrical parameter measurements comprise voltage measurements.

4. The method of claim 1, wherein the triangular excitation signal comprises a sawtooth excitation signal.

5. The method of claim 1, wherein the triangular excitation signal comprises a ramp excitation signal.

6. The method of claim 1, wherein the triangular excitation signal has at least one of a non-uniform amplitude or a non-uniform period.

7. The method of claim 1, wherein the ratio of the voltage spectrogram and the current spectrogram comprises a ratio of Fourier transforms of voltages of the triangular excitation signal and corresponding current measurements.

8. The method of claim 1, further comprising determining an accuracy range of the sampling of the EIS.

9. The method of claim 8, wherein the accuracy range of the sampling of the EIS depends on at least one of:
    a mean square error between a profile of the subject and the measured samples;
    a material parameter of the subject;
    an amplitude of the triangular excitation signal; and
    a period of the triangular excitation signal.

10. An electrochemical impedance spectrogram (EIS) measurement system, comprising:
    a working electrode configured to provide a triangular excitation signal to a subject;
    a counter electrode configured to measure an electrical parameter in response to the triangular excitation signal; and
    a processing device configured to obtain an EIS of the subject based on the triangular excitation signal and the measured electrical parameter, wherein the EIS of the subject is based a ratio of a voltage spectrogram and a current spectrogram, and wherein the processing device is further configured to sample the EIS of the subject at a plurality of frequencies that comprises multiple harmonics of a fundamental frequency of the triangular excitation signal.

11. The EIS measurement system of claim 10, wherein the counter electrode further provides a current return path from the working electrode.

12. The EIS measurement system of claim 10, further comprising a reference electrode configured to provide a reference voltage for the working electrode and the counter electrode.

13. The EIS measurement system of claim 10, wherein the counter electrode is further configured to provide a reference voltage.

14. The EIS measurement system of claim 10, further comprising measuring circuitry coupled to the counter electrode and configured to provide an indication of the electrical parameter to the processing device.

15. The EIS measurement system of claim 10, wherein the ratio of the voltage spectrogram and the current spectrogram comprises a ratio of a fast Fourier transform (FFT) of the triangular excitation signal and a FFT of the measured electrical parameter.

16. The EIS measurement system of claim 15, further comprising a memory coupled to the processing device and storing the FFT of the triangular excitation signal.

17. The EIS measurement system of claim 16, wherein the memory further stores one or more measurement profiles, each measurement profile comprising excitation signal parameters.

18. The EIS measurement system of claim 17, wherein each of the one or more measurement profiles corresponds to a material of the subject.

19. A non-transitory computer-readable medium which, when executed by a processing device, causes the processing device to:
    cause a triangular excitation signal to be applied to a subject;
    obtain electrical parameter measurements in response to the triangular excitation signal;
    measure an electrochemical impedance spectrogram (EIS) of the subject based on the electrical parameter measurements, wherein the EIS of the subject is based a ratio of a voltage spectrogram and a current spectrogram;
sample the EIS of the subject at a plurality of frequencies that comprises multiple harmonics of a fundamental frequency of the triangular excitation signal; and
cause the EIS to be provided to a workstation.

* * * * *